(12) United States Patent
Nitta

(10) Patent No.: US 10,204,854 B2
(45) Date of Patent: Feb. 12, 2019

(54) PACKAGING SUBSTRATE AND METHOD OF FABRICATING THE SAME

(71) Applicant: TOPPAN PRINTING CO., LTD., Tokyo (JP)

(72) Inventor: Yuki Nitta, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/007,490

(22) Filed: Jun. 13, 2018

(65) Prior Publication Data
US 2018/0294217 A1    Oct. 11, 2018

Related U.S. Application Data

(63) Continuation of application No. PCT/JP2017/001744, filed on Jan. 19, 2017.

(30) Foreign Application Priority Data

Jan. 22, 2016  (JP) ................................. 2016-010931

(51) Int. Cl.
*H01L 23/15* (2006.01)
*H01L 23/498* (2006.01)
*H01L 21/48* (2006.01)

(52) U.S. Cl.
CPC ...... *H01L 23/49838* (2013.01); *H01L 21/481* (2013.01); *H01L 21/4846* (2013.01); *H01L 23/15* (2013.01)

(58) Field of Classification Search
CPC ............. H01L 23/49838; H01L 21/481; H01L 21/4846; H01L 23/15

USPC ......................................................... 174/258
See application file for complete search history.

(56) References Cited

U.S. PATENT DOCUMENTS

| | | | |
|---|---|---|---|
| 4,724,182 A * | 2/1988 | Kato | H01L 23/15 219/543 |
| 2009/0206494 A1* | 8/2009 | Sasagawa | H01L 21/32136 257/784 |
| 2014/0035935 A1* | 2/2014 | Shenoy | H01L 23/15 345/501 |

FOREIGN PATENT DOCUMENTS

| JP | 2015-079795 A | 4/2015 |
|---|---|---|
| JP | 2015-231005 A | 12/2015 |

OTHER PUBLICATIONS

International Search Report with English language translation and Written Opinion issued in International Application No. PCT/JP2017/001744 dated Apr. 4, 2017.

* cited by examiner

*Primary Examiner* — Sherman Ng
(74) *Attorney, Agent, or Firm* — Foley & Lardner LLP

(57) ABSTRACT

The packaging substrate according to the present invention is a packaging substrate including: a core substrate; an insulating layer formed on one surface or each of both surfaces of the core substrate; and one or more wiring layers formed on the insulating layer and/or embedded in the insulating layer. The packaging substrate has a thin layer portion where the insulating layer is partially thinned at an outer peripheral portion of the insulating layer.

4 Claims, 9 Drawing Sheets

PACKAGING SUBSTRATE AND METHOD OF FABRICATING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/001744, filed on Jan. 19, 2017, which is based upon and claims the benefit of priority to Japanese Patent Application No. 2016-010931, filed on Jan. 22, 2016, the disclosures of which are all hereby incorporated herein by reference in their entireties.

TECHNICAL FIELD

The present invention relates to a packaging substrate and a method of fabricating the same.

BACKGROUND ART

Packaging substrates of electronic components and the like are fabricated by laminating wiring layers and insulating layers on a core substrate to form a large wiring substrate provided with a number of wiring patterns, followed by dicing the wiring substrate into pieces to produce the packaging substrates each having a predetermined size. In the fabrication of wiring substrates, two or more resin layers (insulating layers) and wiring layers are laminated on a core substrate, the layers each having a linear expansion coefficient different from that of the core substrate. With this configuration, the difference in the linear expansion coefficient increases the difference in expansion between the resin layers, the wiring layers and the core substrate if there is a change in temperature. In such a case, it is known that stress is applied to an outer peripheral portion of the core substrate.

Core substrates used for recent packaging substrates include ones made of materials that are brittle, although they have good electrical properties. When a core substrate is made of such brittle materials with which the core substrate is likely to be broken, minute cracks may develop at the cut surfaces of the core substrate due to the impact generated at the time of cutting the core substrate by dicing. Due to the minute cracks at the cut surfaces of the core substrate, internal stress accumulated in the core substrate due to temperature change is released from cracked portions due to temperature change immediately after dicing or during the subsequent process, which may result in extension of cracks in directions along which the core substrate splits. When such a core substrate is a glass substrate having a thickness of more than several tens of micrometers, and used in a laminate, the glass substrate is likely to split from the end surfaces.

Examples of a method of dicing a wiring substrate into pieces without developing such cracks include a method of forming a metal layer at a portion of the core substrate, corresponding to an outer peripheral portion of the packaging substrate, followed by etching away the metal layer that has been exposed after dicing the wiring substrate into pieces to create a trench constituted by the core substrate and an insulating layer. Provision of the trench can better prevent the outer peripheral portion of the core substrate from being stressed. Therefore, such a simple configuration can effectively better prevent breakage of the core substrates (see, for example, PTL 1).

This method, however, uses a dicing blade to cut the metal layer on the core substrate, and therefore cutting ability of the dicing blade may be decreased due to clogging of the dicing blade. In that case, cracks are more likely to occur at the cut surface of the core substrate. Therefore, the core substrate may be broken immediately after being diced into pieces in a dicing process.

CITATION LIST

[Patent Literature] [PTL 1] JP 2015-231005 A

SUMMARY OF THE INVENTION

Technical Problem

The present invention aims to provide a packaging substrate that better improves or prevents breakage of a cut surface of a core substrate due to temperature change during or after fabricating the packaging substrate by dicing a wiring substrate into pieces, the wring substrate being formed by laminating an insulating layer and wiring layers on the core substrate, and a method of fabricating the same.

Solution to Problem

An aspect of the present invention is a packaging substrate including: a core substrate; an insulating layer formed on one surface or each of both surfaces of the core substrate; and one or more wiring layers formed on the insulating layer and/or embedded in the insulating layer, wherein the packaging substrate has a thin layer portion where the insulating layer is partially thinned at an outer peripheral portion of the insulating layer.

In another aspect of the present invention, the core substrate is made of glass.

In another aspect of the present invention, the thin layer portion has a width w3 [m] between an end of the thin layer portion and a stepped surface of the insulating layer, wherein the w3 has a value determined by the following formula:

[Math 1]
$$w_3 \geq \sqrt{\frac{\alpha \cdot E \cdot \Delta T \cdot L \cdot d}{637 \times 10^7}}$$

wherein α [ppm/K] represents a linear expansion coefficient of each wiring layer and the insulating layer, E [Pa] represents a Young's modulus of each wiring layer and the insulating layer, ΔT [K] represents a predetermined temperature difference, d [m] represents a composite thickness of each wiring layer and the insulating layer, and L [m] represents the length from an end of the thin layer portion to the other end of the thin layer portion.

In another aspect of the present invention, the $w_3$ is 120 μm or more.

Still another aspect of the present invention provides a method of fabricating the packaging substrate.

Advantageous Effects of the Invention

According to a packaging substrate and a method of fabricating the same of the present invention, it is possible to provide a packaging substrate with high reliability that better improves or prevents breakage of the cut surface of a core substrate when a large temperature change is imposed on the packaging substrate when fabricating or mounting the packaging substrate fabricated by dicing a wiring substrate into pieces.

DESCRIPTION OF REPRESENTATIVE EMBODIMENTS

Embodiments of a packaging substrate and a method of fabricating the same according to the present invention will hereafter be described in detail with reference to the drawings. The representative embodiments described below are merely examples of the present invention, and the design thereof could be appropriately changed by one skilled in the art.

In the present specification, the term "packaging substrate" refers to a laminate fabricated by dicing a wiring substrate into pieces. Further, the term "wiring substrate" refers to a wiring substrate before being diced into pieces by dicing, that is, packaging substrates in a state of being continuous.

It is known that, when a core substrate provided with an insulating layer and a wiring layer is diced as described above, minute cracks are likely to develop at the cut surface of the core substrate due to the impact generated during dicing. Thermal stresses of the insulating layer and the wiring layer generate tensile stress to the core substrate. This tensile stress extends the cracks of the core substrate, resulting in breakage of the core substrate.

The inventor of the present invention has found that provision of thin layer portions on the surface of the core substrate by partially removing the insulating layer formed on the core substrate at a position near the cut surface of the core substrate can reduce tensile stress occurring in the core substrate to better prevent breakage of the core substrate, and completed the present invention.

(Packaging Substrate)

Figure 1:
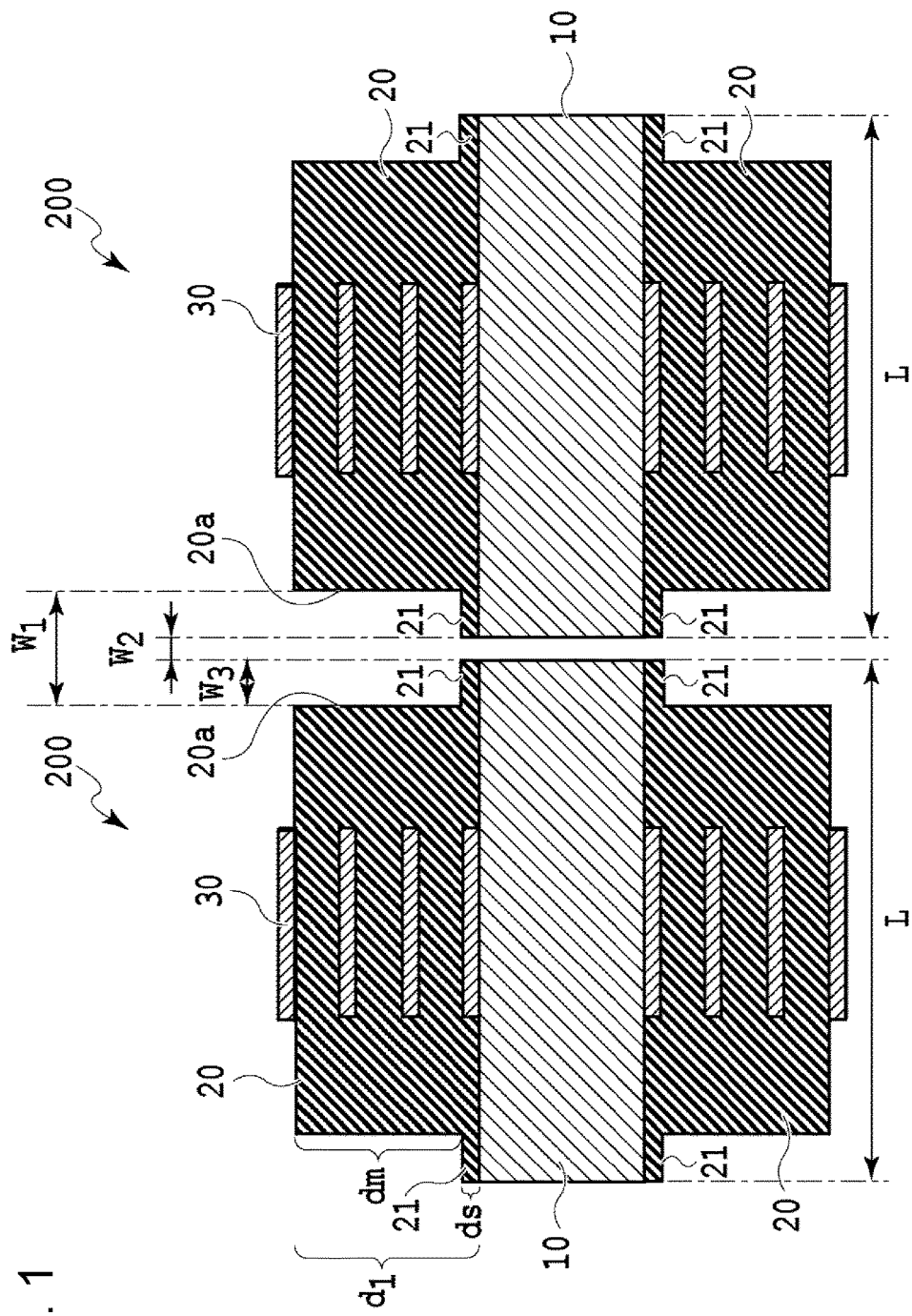
FIG. 1 is a cross-sectional view of a packaging substrate according to the present invention.

FIG. 1 is a cross-sectional view of a packaging substrate according to the present invention. As shown in FIG. 1, a packaging substrate 200 includes a core substrate 10, insulating layers 20, and one or more wiring layers 30 laminated on both surfaces of the core substrate 10 in the thickness direction of the core substrate 10. The packaging substrate 200 has a thin layer portion 21 that is configured such that the insulating layer 20 is partially thinned.

Figure 2:
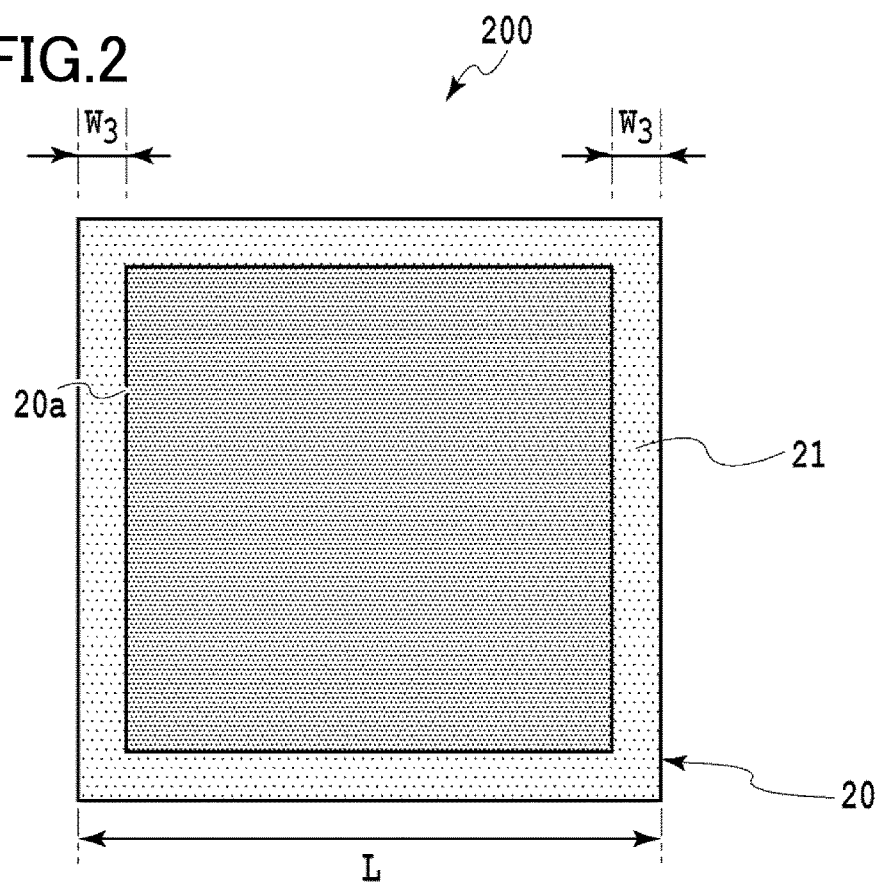
FIG. 2 is a top view of the packaging substrate according to the present invention.

FIG. 2 is a top view of a packaging substrate 200 according to the present invention. As shown in FIG. 2, the thin layer portion 21 is provided at the outer peripheral portion of the insulating layer 20. In FIG. 2, wiring layers 30 are omitted for the sake of simplification.

Figure 3:
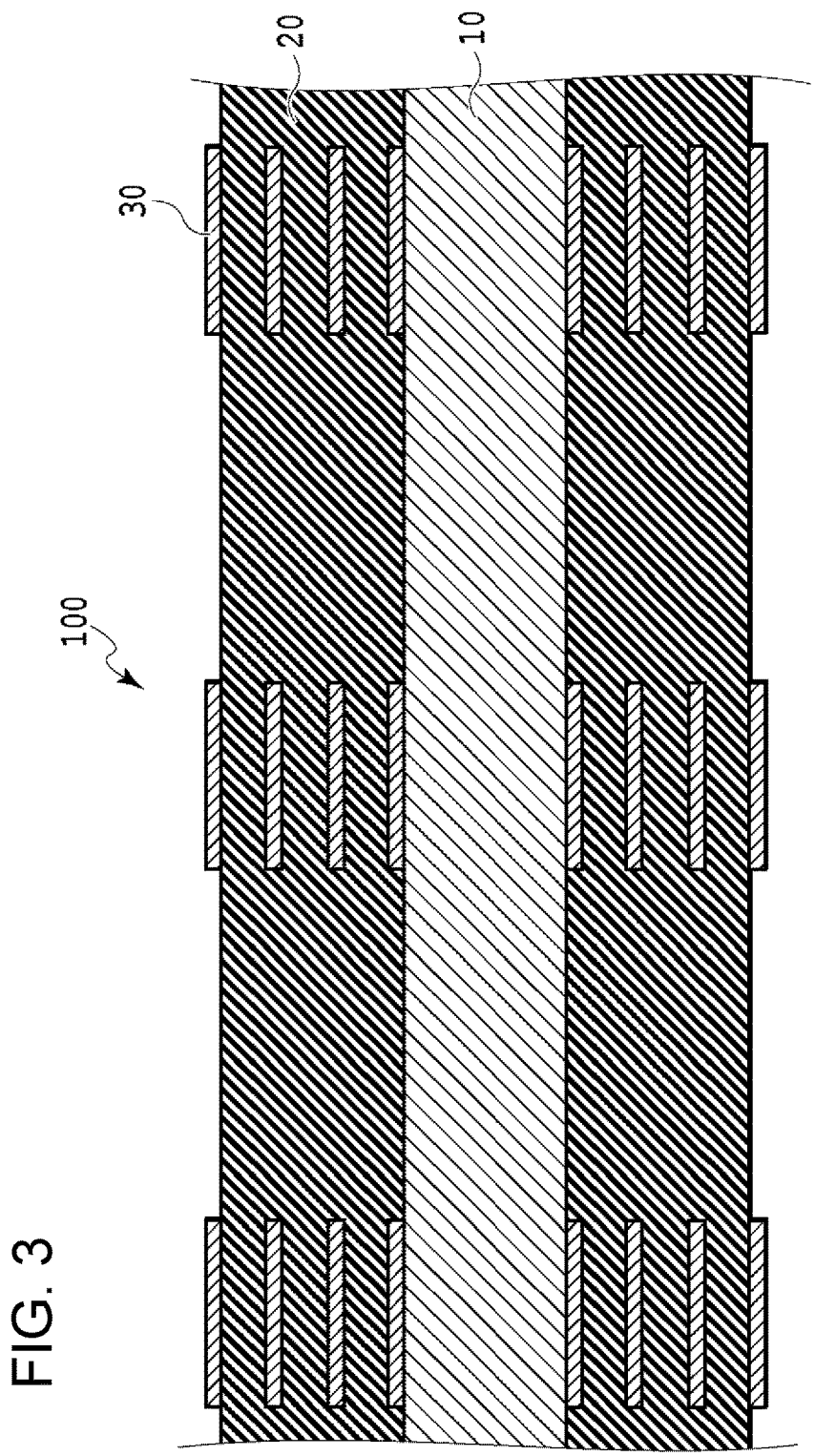
FIG. 3 is a schematic cross-sectional view of a wiring substrate according to the present invention.

FIG. 3 is a cross-sectional view of a wiring substrate according to the present invention. By dicing a wiring substrate 100 shown in FIG. 3 into pieces by a method described later, the packaging substrate 200 can be fabricated.

(Core Substrate)

The core substrate 10 can be made of a material that improves the electrical properties of the wiring substrate 100 and the packaging substrate 200. Examples of the material for the core substrate 10 include a brittle material such as a glass substrate, silicon substrate, ceramic substrate, plastic plate, or plastic tape. The core substrate 10 is preferably a glass substrate made of, for example, a soda-lime glass, alumino-silicate glass or the like. The glass substrate used for the core substrate 10 of the present invention may be surface-treated by a method generally used in the art. For example, the glass substrate may be surface-treated by a roughening process, by hydrofluoric acid, or by silicon. In one aspect of the present invention, a glass substrate used for the core substrate 10 may have an underlayer (not shown) formed on the surface of the glass substrate. The thickness of the core substrate 10 is not particularly limited, but is preferably in the range of 50 μm to 700 μm.

(Wiring Layer)

The wiring layers 30 are formed on the surfaces of the core substrate 10 in the thickness direction of the core substrate 10, and/or on the surfaces of the insulating layers 20, and/or inside the insulating layers 20. In one aspect of the present invention, at least one wiring layer 30 is formed so as to be in contact with the core substrate 10. In another aspect of the present invention, the wiring layers 30 may not be in contact with the core substrate. Each wiring layer 30 may be formed of a single layer or a plurality of layers.

The wiring layers 30 may be made of a conductive material commonly used in the art. Specifically, the wiring layers 30 can be made of copper, silver, tin, gold, tungsten, conductive resin or the like. For the wiring layers 30, copper is preferably used. The wiring layers 30 can be formed by a method that is common in the art. Examples of a method of forming the wiring layers 30 include, but are not limited to, a subtractive process, a semi-additive process, ink-jet printing, screen-printing, or gravure offset printing. The method of forming the wiring layers 30 may preferably be the semi-additive process. Each wiring layer 30 basically has a thickness smaller than that of the core substrate 10 and the insulating layers 20. Total thickness of each wiring layer 30 is preferably, for example, in the range of 1 μm to 100 μm, although it depends on the method of forming the wiring layers 30.

(Insulating Layer)

In one aspect of the present invention, the insulating layers 20 are formed over the core substrate 10 and the wiring layers 30 so as to embed the wiring layers 30. Each insulating layer 20 may be formed of a single layer or a plurality of layers.

The insulating layers 20 may be made of an insulating material that is common in the art. Specifically, the insulating layers 20 can be made of an epoxy resin-based material, an epoxy acrylate-based resin, a polyimide-based resin and the like. These insulating materials may each contain a filler. As the insulating material forming the insulating layers 20, an epoxy-containing resin having a linear expansion coefficient in the range of 7 to 130 ppm/K is preferable because it is easily available in general.

The insulating material forming the insulating layers 20 may be a liquid or a film. When the insulating material is a liquid, the insulating layers 20 can be formed by a method such as of spin coating, die coating, curtain coating, roll coating, doctor blading, or screen printing that are common in the art. When the insulating material is a film, the insulating layers 20 can be formed, for example, by vacuum lamination. Each insulating layer 20 formed as described above may be cured by heating or light irradiation. Each insulating layer 20 has a thickness $d_1$ which is preferably in the range of 1 μm to 200 μm, although the thickness depends on the method of forming the insulating layers 20.

(Formation of Packaging Substrate)

The packaging substrate 200 according to an aspect of the present invention can be formed according to the steps shown in FIGS. 3 to 9, but the steps are not limited thereto. First of all, as shown in FIG. 3, the wiring layers 30 and the insulating layers 20 are formed on the surfaces of the core substrate 10 in the thickness direction of the core substrate 10 to form the wiring substrate 100 by the method described above.

Figure 4:
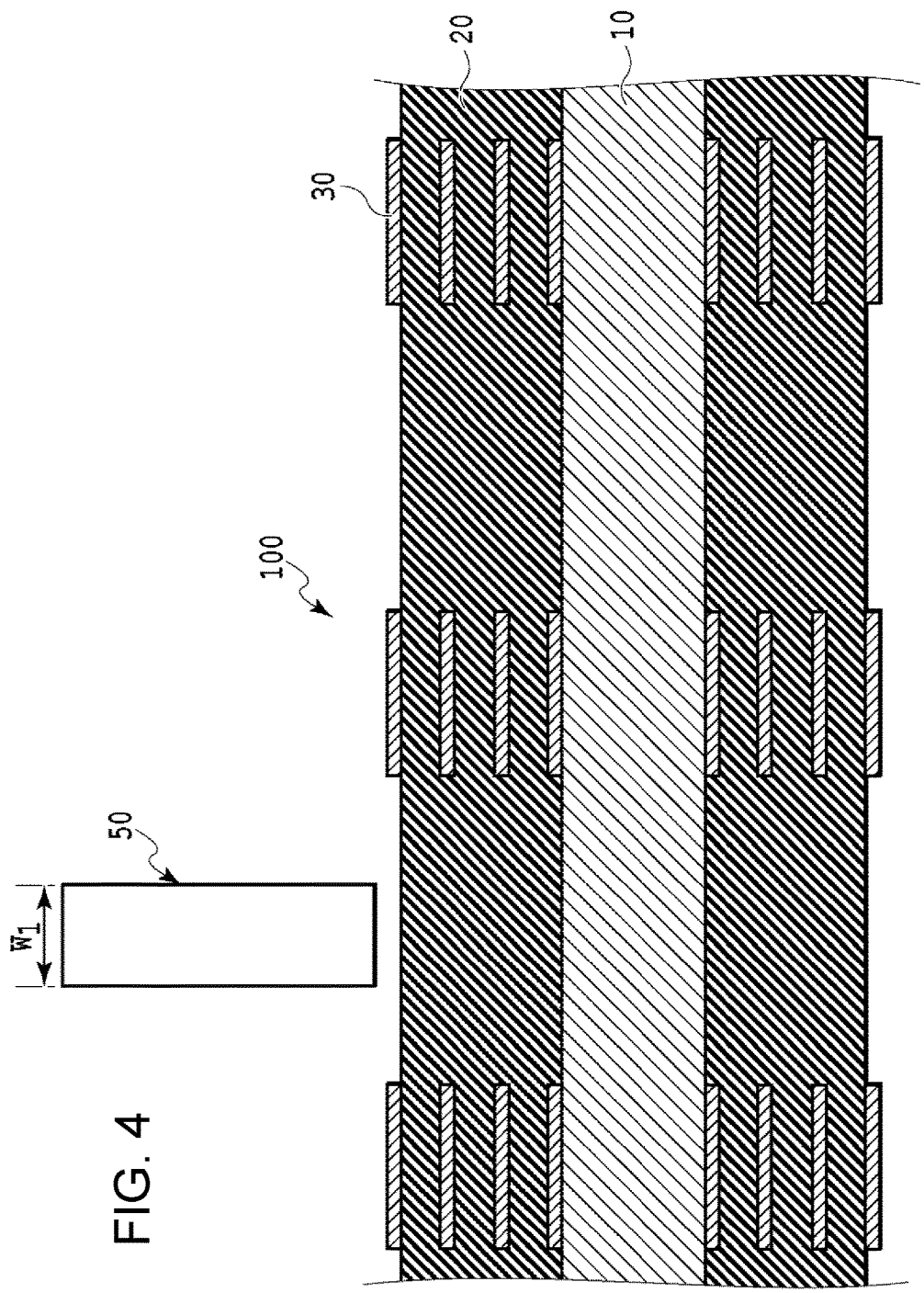
FIG. 4 is a schematic diagram illustrating a step of fabricating the packaging substrate according to the present invention.
Figure 5:
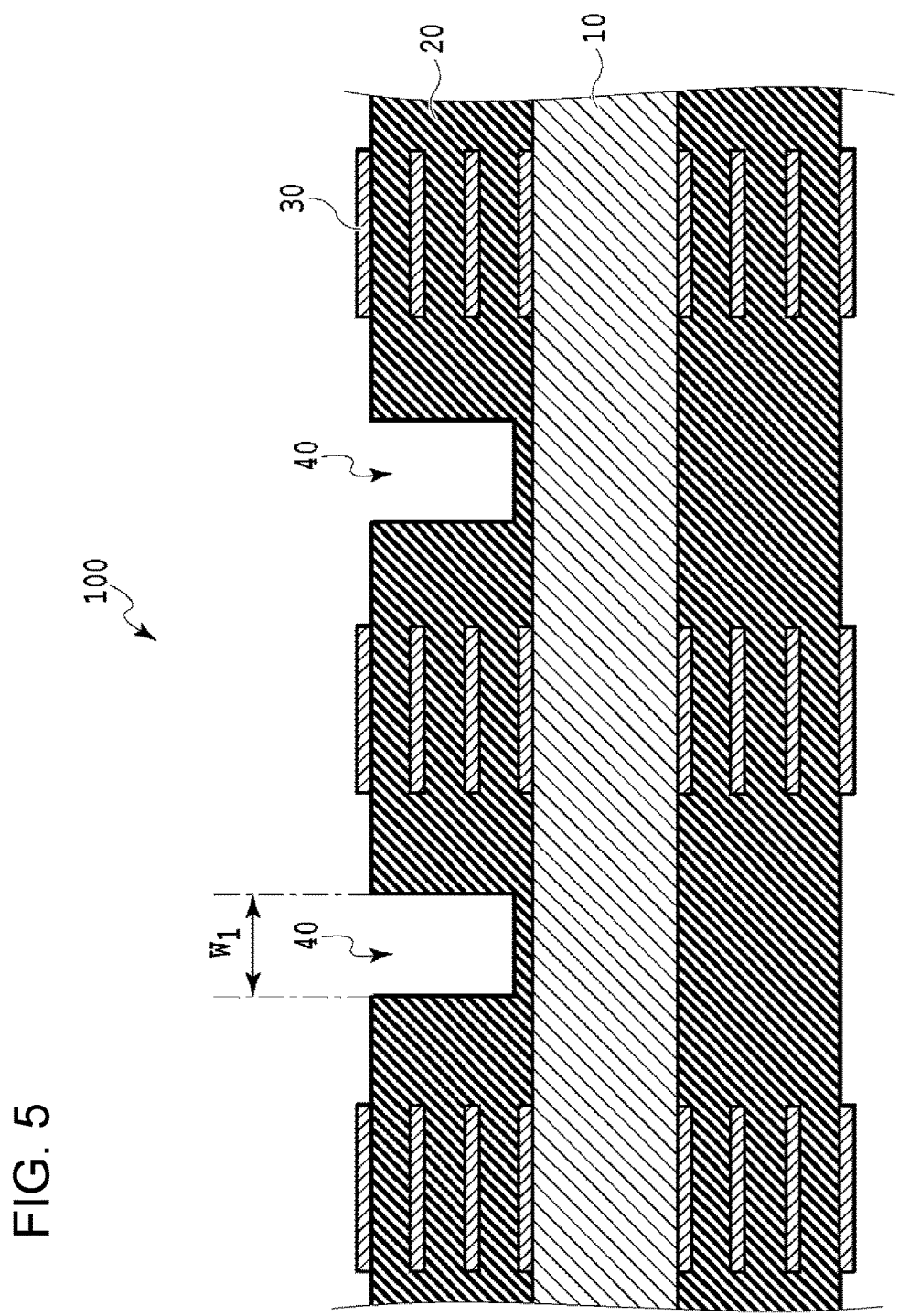
FIG. 5 is a schematic diagram illustrating a step of fabricating the packaging substrate according to the present invention.

Then, as shown in FIGS. 4 and 5, isolation trenches 40 each having a depth $d_m$ are formed, from a first surface side, at predetermined positions of the insulating layer 20 of the wiring substrate 100 by using a first dicing blade 50 having a tip width $w_1$. By using the first dicing blade 50 having the tip width $w_1$, the isolation trenches 40 having a width $w_1$ at the bottom surface thereof can be formed. When the tip of the first dicing blade 50 has a tapered shape, the width of the portion having the largest width is taken to be the width of the tip of the dicing blade. The same applies to a second dicing blade 60 described later.

The first dicing blade 50 may be any dicing blade as long as it is used for typical dicing. For example, the first dicing blade 50 may be a diamond blade where diamond abrasive grains are embedded in a resin. The thin layer portion 21 of each insulating layer 20 that is left on the core substrate 10 has a thickness ds which is, for example, $0<d_s\leq 45$ μm. By allowing the thickness ds of each insulating layer 20 to remain on the core substrate 10, the surface of the core substrate 10 can be protected to better prevent chipping of the core substrate material caused by dicing. As shown in FIG. 1, the sum of $d_m$ and $d_s$ is equal to the thickness $d_1$ of each insulating layer 20.

Figure 6:
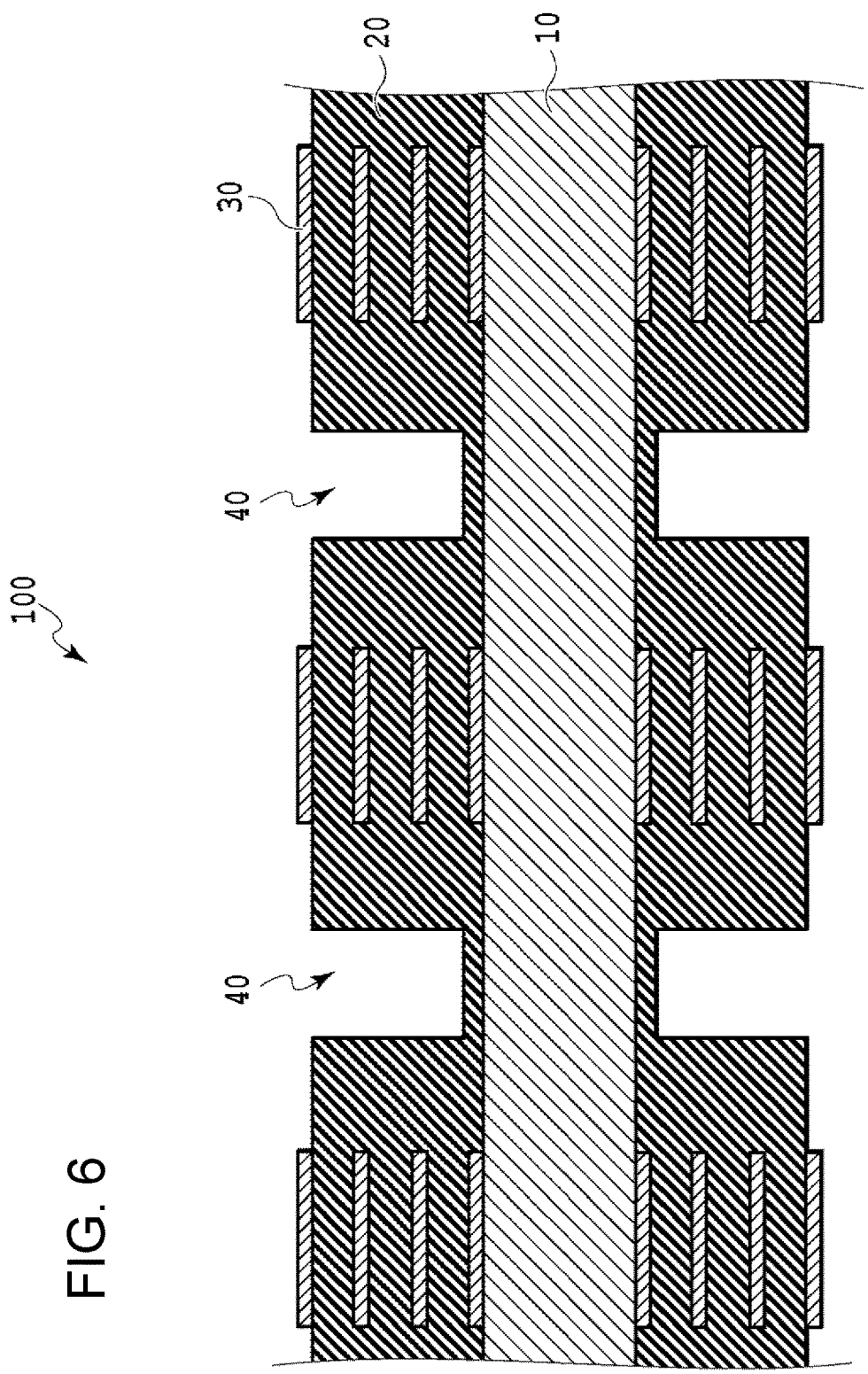
FIG. 6 is a schematic diagram illustrating a step of fabricating the packaging substrate according to the present invention.

Then, as shown in FIG. 6, the isolation trenches 40 are similarly formed on a second surface of the wiring substrate 100.

Figure 7:
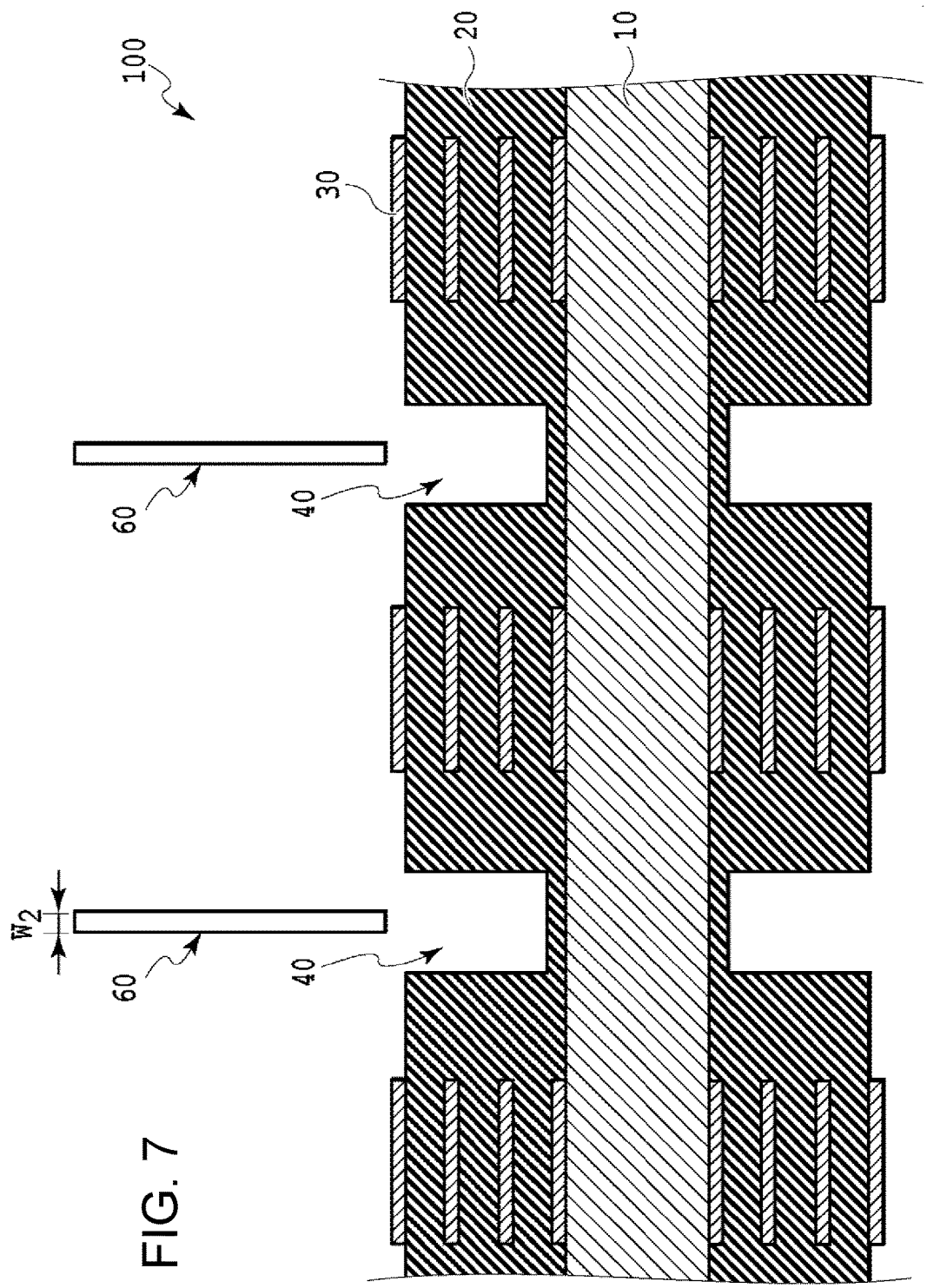
FIG. 7 is a schematic diagram illustrating a step of fabricating the packaging substrate according to the present invention.
Figure 8:
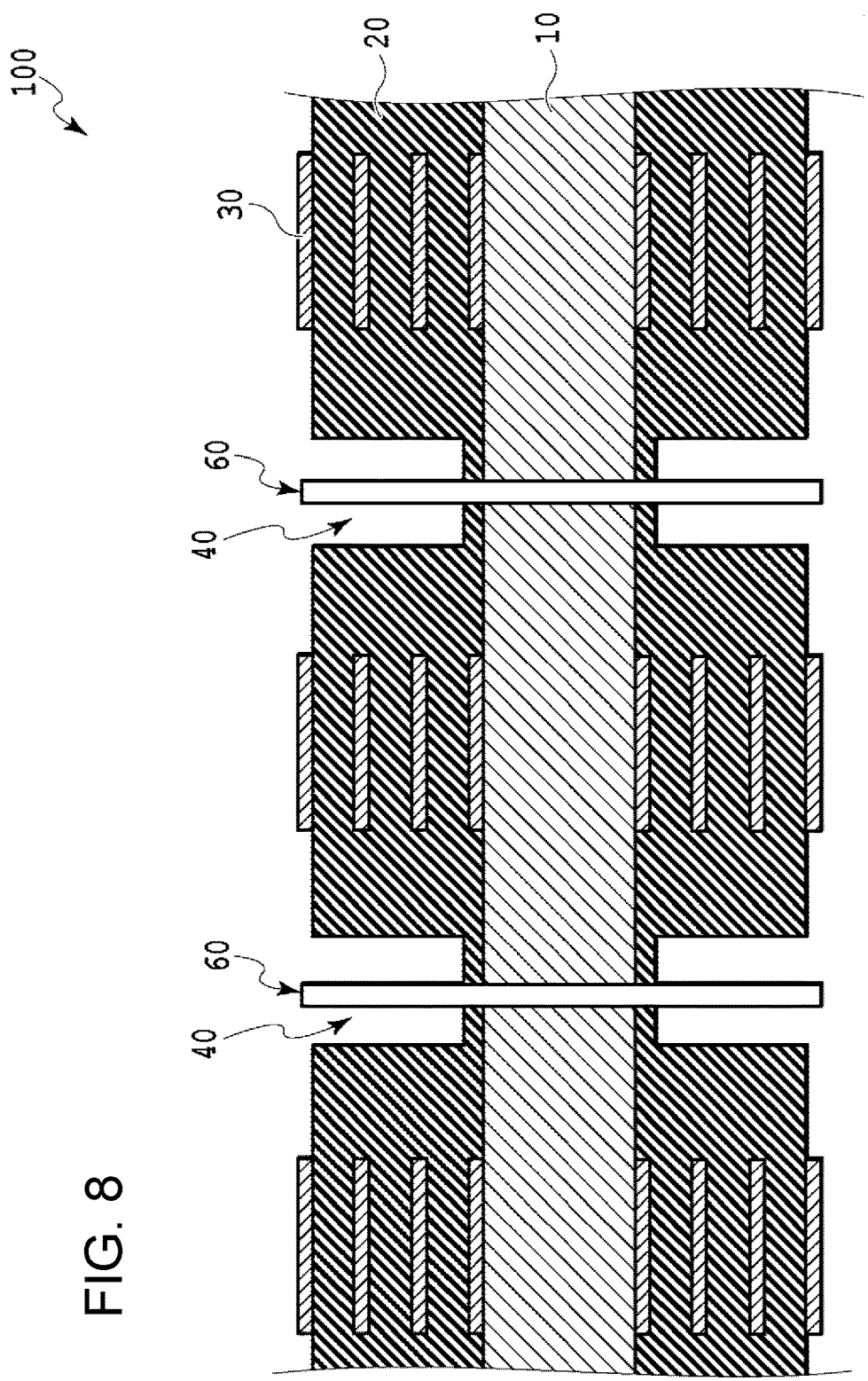
FIG. 8 is a schematic diagram illustrating a step of fabricating the packaging substrate according to the present invention.

Then, as shown in FIGS. 7 and 8, the wiring substrate 100 is diced into pieces by dicing the insulating layers 20 and the core substrate 10 along the line passing through the center of the width of the bottom surface of each isolation trench 40, by using the second dicing blade 60. The second dicing blade 60 has a tip width $w_2$ which is smaller than the tip width $w_1$ of the first dicing blade 50, that is, smaller than the width $w_1$ of the bottom surface of each isolation trench 40.

Since each insulating layer 20 is thinned at the bottom surface of each isolation trench 40, each packaging substrate 200 fabricated by cutting the wiring substrate 100 at the center of each isolation trench 40 has the thin layer portion 21 where the insulating layers 20 are partially thinned on the surfaces of outer peripheral portions thereof. Let us assume that the vertical surface between the surface of the thick layer portion in the insulating layer 20 and the surface of the thin layer portion 21 is a stepped surface 20a, and the length from an end of the insulating layer 20 in the thin layer portion 21 to the stepped surface 20a is a width $w_3$. It has been found that the width $w_3$ is preferably 120 μm or more, as will be described later, although the width $w_3$ depends on the thickness or the material of the insulating layers 20 and the wiring layers 30. The width $w_3$ of the thin layer portion 21 may be configured to be different between the front and the back surfaces of the packaging substrate 200.

Figure 9:
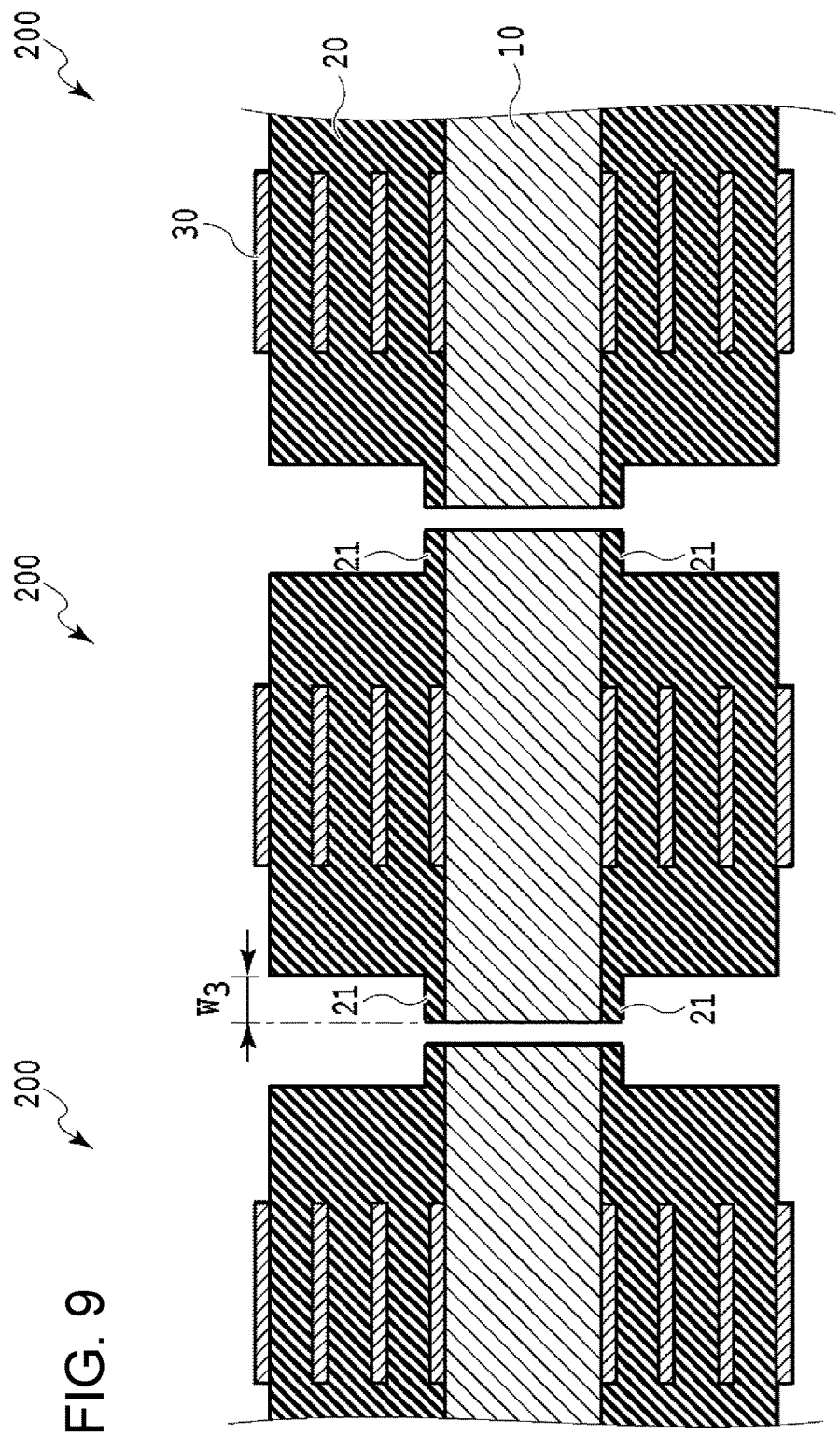
FIG. 9 is a schematic diagram illustrating a step of fabricating the packaging substrate according to the present invention.

As described above, by dicing the wiring substrate 100 into pieces at the center of each isolation trench 40, a plurality of packaging substrates 200 is formed as shown in FIG. 9.

It is difficult to estimate an exact value of $w_3$, but it is expected that the value is influenced by: a linear expansion coefficient α [ppm/K] and a Young's modulus E [Pa] of a laminate formed by laminating the wiring layers 30 and the insulating layers 20, the laminate being regarded as integrated materials; a temperature difference ΔT [K] between the highest temperature of the insulating layer 20 at the time of lamination and the lowest temperature of the insulating layer 20 in a temperature cycle test (TCT) for giving temperature change; a length L [m] of one side of the packaging substrate 200, the side extending from an end of the thin layer portion 21 to the other end thereof; a composite thickness d [m] which is the sum of thicknesses of the wiring layers 30 and the insulating layer 20 laminated on the core substrate 10; and a representative stress value F [Pa] that the core substrate 10 can withstand, based on the strength of the core substrate 10. In the present invention, the lower limit value of $w_3$ [m] is regarded to be proportional to a square root of α·E·ΔT/F which is a dimensionless quantity, and also regarded to be proportional to a square root of L·d so as to match the results of the experiments. That is, the following (Formula 1) is regarded to be approximately established.

[Math 2]

$$w_3 \geq \sqrt{\frac{\alpha \cdot E \cdot \Delta T \cdot L \cdot d}{F}} \quad \text{(Formula 1)}$$

Using, for example, a temperature change of 125° C. to −55° C. prescribed as a standard in the temperature cycle test (TCT) described below, ΔT can be determined to be equal to 180 K (ΔT=180 K). F can be determined in a back calculation manner through Formula 1 using the lower limit value w3 determined from the evaluations of the temperature cycle test (TCT) for the packaging substrate.

α and E used for the calculation of the width w3 are determined by using conditions shown in Table 1 below and Formulas 2 to 4 provided below.

TABLE 1

| | Linear Expansion Coefficient | Young's Modulus | Thickness |
|---|---|---|---|
| Insulating Layer | $\alpha_1$ | $E_1$ | $d_1$ |
| Wiring Layer | $\alpha_2$ | $E_2$ | $d_2$ |
| Equivalent composite (Insulating Layer + Wiring Layer) | α | E | d |

Composite physical properties α, E and d of the insulating layer 20 and the wiring layer 30 can be calculated using Formulas 2 to 4 mentioned below. The wiring layers 30 are embedded in each insulating layer 20, and therefore d is expressed by the following Formula 2.

$$d = d_1 \quad \text{(Formula 2)}$$

As shown in Formula 2, the thickness $d_1$ of the insulating layer 20 can be regarded as a composite thickness d which is a sum of thicknesses of the insulating layer 20 and the wiring layers 30.

Since the wiring layers 30 are formed according to a wiring pattern, the wiring layers 30 are not actually formed over the entire surface. However, for the purpose of generalization, if the wiring layers 30 are taken to be formed on the entire surface in the calculations (more strict conditions are established in terms of the occurrence of breakage in the core substrate if the wiring layers 30 are assumed to be formed over the entire surface), the composite Young's modulus E can be determined using the following Formula 3, since the ratio of thicknesses $d_1$ to $d_2$ is equal to the volume ratio of insulating layers 20 to wiring layers 30.

[Math 3]

$$E = \frac{E_1 d_1}{d} + \frac{E_2 d_2}{dt} \quad \text{(Formula 3)}$$

Assuming that each layer is to be formed on the entire surface, the volumes of each insulating layer 20 and each wiring layers 30 are regarded as $V_1$ and $V_2$, respectively, and the Poisson ratios of each insulating layer 20 and each wiring layers 30 are regarded as $v_1$ and $v_2$, respectively. In this case, the composite linear expansion coefficient (CTE) α is expressed by the following Formula 4.

[Math 4]

$$\alpha = \frac{(1-v_2)\alpha_1 E_1 V_1 + (1-v_1)\alpha_2 E_2 V_2}{(1-v_2)E_1 V_1 + (1-v_1)E_2 V_2} \quad \text{(Formula 4)}$$

The width $w_3$ according to the linear expansion coefficient, Young's modulus, thickness, Poisson ratio and volume of each wiring layer 30 and insulating layer 20 can be determined by using Formulas 2 to 4 in the calculation of Formula 1 after empirically determining F.

formed by allowing the thickness ds of each insulating layer 20 to remain on the core substrate 10 at the outer peripheral portion thereof, both surfaces of the core substrate 10 are protected to better prevent chipping of the core substrate 10.

EXAMPLES

Examples of the present invention are described below, however the following examples do not limit the range of application of the present invention.

Example 1

The core substrate 10 was made of aluminosilicate glass, and the thickness of the core substrate 10 was set to 300 μm. On both surfaces of the core substrate 10, the wiring layers 30 each having a thickness of 5 μm were formed in a thickness direction of the core substrate 10 by copper plating using a semi-additive method. After laminating the wiring layers 30 on the core substrate 10, an insulating material which was an epoxy-containing resin was laminated on both surfaces of the core substrate 10 by vacuum lamination at 190° C., to form insulating layers 20. Then, the wiring layers 30 and the insulating layers 20 were repeatedly formed to produce a laminate of four wiring layers 30 and three insulating layers 20 on both surfaces of the core substrate 10. Thus, the wiring substrate 100 shown in FIG. 3 was obtained. Each insulating layer 20 on both surfaces of the core substrate 10 had a thickness $d_1$ of 60 μm.

Then, as shown in FIGS. 4 and 5, isolation trenches 40 each having the trench width $w_1$ of 390 μm at a bottom surface and a depth of 45 μm were provided, from a first surface side, at predetermined positions of each insulating layer 20 by using a first dicing blade 50 having the tip width $w_1$ of 390 μm to dice the wiring substrate 100 into pieces. Then, as shown in FIG. 6, the isolation trenches 40 each having the width $w_1$ of 390 μm and a depth 45 μm were also formed from a second surface side of the insulating layer 20.

After forming the isolation trenches 40, insulating layers 20 and the core substrate 10 were diced, as shown in FIGS. 7 and 8, at the center of the trench width of each isolation trench 40 to dice the wiring substrate 100 into pieces by using a second dicing blade 60 having the tip width $w_2$ of 150 μm. Thus, packaging substrates 200 were obtained. The size of the packaging substrate 200 was set to be 10 mm×10 mm (L=10 mm). As a result, the width $w_3$ of the thin layer portion 21 was 120 and the thickness ds of the thin layer portion 21 was 15 μm.

In Example 1, regarding the linear expansion coefficient, Young's modulus, thickness, Poisson ratio and volume, values shown in the following Table 2 were used.

TABLE 2

| | Linear Expansion Coefficient (ppm/K) | Young's Modulus [Pa] | Thickness [m] | Poisson Ratio | Volume [m³] |
|---|---|---|---|---|---|
| Insulating Layer | $\alpha_1 = 23$ | $E_1 = 7.5 \times 10^9$ | $d_1 = 60 \times 10^{-6}$ | $v_1 = 0.37$ | $V_1 = 6 \times 10^{-9}$ |
| Wiring Layer | $\alpha_2 = 17$ | $E_2 = 120 \times 10^9$ | $d_2 = 20 \times 10^{-6}$ | $v_2 = 0.343$ | $V_2 = 2 \times 10^{-9}$ |
| Equivalent composite (Insulating Layer + Wiring Layer) | $\alpha = 18$ | $E = 47.5 \times 10^9$ | $d = 60 \times 10^{-6}$ | | |

Use of such a packaging substrate 200, can reduce the tensile stress applied to an end surface of the core substrate 10 caused by the difference in thermal stress between the core substrate 10, insulating layers 20 and wiring layers 30 to reduce breakage of the core substrate 10 caused by stress. Moreover, by providing the thin layer portion 21 that is Using a temperature change of 125° C. to −55° C. prescribed as a standard in the temperature cycle test (TCT) mentioned below, ΔT was set to be equal to 180 K (ΔT=180 K), and the width w3 of the thin layer portion 21 was set to 120 μm.

1000 cycles of temperature cycle test (TCT) MIL-STD-883H for giving temperature change of 125° C. to −55° C. was performed on 10 packaging substrates 200 fabricated in Example 1. As a result, in the fabricated packaging substrates 200, reliability was not impaired due to breakage of the core substrate 10 and the like.

Example 2

In Example 2, for the wiring substrate 100 formed with conditions similar to those of the wiring substrate used in Example 1, the tip width $w_1$ of the first dicing blade 50 was changed to 450 µm, while all other conditions including the tip width of the second dicing blade 60 and the like remained the same as those of Example 1. As a result, packaging substrates 200 obtained in Example 2 were provided with the isolation trenches 40 each having a width $w_1$ of 450 µm, and the thin layer portions 21 each having a width $w_3$ of 150 µm on both surfaces thereof.

1000 cycles of temperature cycle test MIL-STD-883H for giving temperature change of 125° C. to −55° C. was performed on 10 packaging substrates 200 fabricated in Example 2. As a result, in the fabricated packaging substrates 200, reliability was not impaired due to breakage of the core substrate 10 and the like.

Example 3

In Example 3, for the wiring substrate 100 formed with conditions similar to those of the wiring substrate used in Example 1, the tip width $w_1$ of the first dicing blade 50 was changed to 750 µm, while all other conditions including the tip width of the second dicing blade 60 and the like remained the same as those of Example 1. As a result, packaging substrates 200 obtained in Example 3 were provided with the isolation trenches 40 each having a width $w_1$ of 750 µm and the thin layer portions 21 each having a width $w_3$ of 300 µm.

1000 cycles of temperature cycle test MIL-STD-883H for giving temperature change of 125° C. to −55° C. was performed on 10 packaging substrates 200 fabricated in Example 3. As a result, in the fabricated packaging substrates 200, reliability was not impaired due to breakage of the core substrate 10 and the like.

Example 4

In Example 4, packaging substrates 200 were obtained in the same manner as in Example 1, except that the value of ds was changed to 30 µm.

1000 cycles of temperature cycle test MIL-STD-883H for giving temperature change of 125° C. to −55° C. was performed on 10 packaging substrates 200 fabricated in Example 4. As a result, in the fabricated packaging substrates 200, reliability was not impaired due to breakage of the core substrate 10 and the like.

Example 5

In Example 5, packaging substrates 200 were obtained in the same manner as in Example 1, except that the value of ds was changed to 45 µm.

1000 cycles of temperature cycle test MIL-STD-883H for giving temperature change of 125° C. to −55° C. was performed on 10 packaging substrates 200 fabricated in Example 5. As a result, in the fabricated packaging substrates 200, reliability was not impaired due to breakage of the core substrate 10 and the like.

COMPARATIVE EXAMPLE

Comparative Example 1

Packaging substrates of 10 mm×10 mm were obtained in the same manner as in Example 1, except that the isolated trenches 40 were not provided, that is, the thin layer portions 21 were not provided. The packaging substrates fabricated in Comparative Example 1 were left to stand at room temperature for 3 days. 3 days after, cracking was observed in 7 core substrates out of 10 core substrates.

Comparative Example 2

In Comparative Example 2, packaging substrates of 10 mm×10 mm were obtained in the same manner as in Example 1, except that the width $w_3$, $d_m$, and $d_s$ of the thin layer portion 21 was set to 60 µm, 55 µm, and 5 µm, respectively.

The packaging substrates fabricated in Comparative Example 2 were left to stand at room temperature for 3 days, 3 days after, cracking was observed in 7 core substrates out of 10 core substrates.

EVALUATIONS

The following Table 3 shows a summary of evaluations of the Examples and Comparative Examples.

TABLE 3

| | $w_3$ (actual measured value) [µm] | $d_s$ [µm] | Evaluations |
|---|---|---|---|
| Example 1 | 120 | 15 | ○ TCT 1000 cycles |
| Example 2 | 150 | 15 | ○ TCT 1000 cycles |
| Example 3 | 300 | 15 | ○ TCT 1000 cycles |
| Example 4 | 120 | 30 | ○ TCT 1000 cycles |
| Example 5 | 120 | 45 | ○ TCT 1000 cycles |
| Comparative Example 1 | 0 | No thin layer portion | x After being left at normal temperature |
| Comparative Example 2 | 60 | 5 | x After being left at normal temperature |

As shown in Table 3, the core substrate 10, insulating layers 20, and wiring layers 30 with conditions of Examples 1 to 5 are considered to provide packaging substrates that can prevent breakage of the cut surfaces of the core substrate, by setting the width $w_3$ of each thin layer portion 21 to 120 µm or more.

Here, the lower limit of the width $w_3$ of the thin layer portion 21 was set to 120 µm based on the evaluations set forth above, and $w_3$=120 µm was substituted into Formula 1 provided above to back-calculate the value of F. As a result, it was found that F=637×10$^7$ [Pa] was established. Therefore, in the case where the core substrate 10 is made of glass, by substituting F=637×10$^7$ [Pa] in Formula 1 mentioned above, the width $w_3$ of the thin layer portion 21 can be determined according to the following Formula 5.

[Math 5]

$$w_3 \geq \sqrt{\frac{\alpha \cdot E \cdot \Delta T \cdot L \cdot d}{637 \times 10^7}} \qquad \text{(Formula 5)}$$

In the case where the core substrate 10 is made of glass, use of Formula 5 is considered to enable estimation of the value of the width $w_3$ of each thin layer portion 21 even if conditions of the laminate formed of the insulating layers 20 and the wiring layers 30 change.

As described above, it is considered that packaging substrates 200 of the present invention better improved and even prevented extension of minute cracks caused by thermal stress that leads to breakage of the core substrate 10, the packaging substrates 200 each having the thin layer portion 21 that is formed by partially removing the outer peripheral portions of each insulating layer 20.

In FIG. 2, the packaging substrate 200 is shown in a square shape in plan view. However, the shape of the packaging substrate 200 is not limited thereto, and the packaging substrate 200 may be formed, for example, into a rectangular shape in plan view.

REFERENCE SIGNS LIST

10 . . . Core substrate; 20 . . . Insulating layer; 21 . . . Thin layer portion; 30 . . . Wiring layer; 40 . . . Isolation trench; 50 . . . First dicing blade; 60 . . . Second dicing blade; 100 . . . Wiring substrate; 200 . . . Packaging Substrate.

What is claimed is:

1. A packaging substrate comprising: a core substrate; an insulating layer formed on one surface or each of both surfaces of the core substrate; and at least one wiring layer formed on the insulating layer and/or embedded in the insulating layer, wherein the packaging substrate has a thin layer portion where the insulating layer is partially thinned at an outer peripheral portion of the insulating layer, wherein the core substrate is made of glass, and wherein the thin layer portion has a width w3 [m] between an end of the thin layer portion and a stepped surface of the insulating layer, the w3 has a value determined by the following formula:

$$w3 \geq \sqrt{(\alpha * E * \Delta T * L * d)/(637 \times 10^{-7})} \quad \text{[Math 1]}$$

wherein $\alpha$ [ppm/K] represents a linear expansion coefficient of the wiring layer and the insulating layer, E [Pa] represents a Young's modulus of the wiring layer and the insulating layer, $\Delta T$ [K] represents a predetermined temperature difference, d [m] represents a composite thickness of the wiring layer and the insulating layer, and L [m] represents a length from an end of the thin layer portion to the other end of the thin layer portion.

2. The packaging substrate of claim 1, wherein the w3 is 120 μm or more.

3. A method of fabricating a packaging substrate comprising: a step of forming a wiring layer and an insulating layer on one surface or each of both surfaces of a core substrate to form a wiring substrate; a step of forming an isolation trench at a predetermined position of the insulating layer by dicing, using a first dicing blade so that the insulating layer is partially thinned; and a step of dicing the insulating layer and the core substrate at a center of a width of a bottom surface of the isolation trench, using a second dicing blade having a tip width smaller than a tip width of the first dicing blade to obtain a plurality of packaging substrates each having a thin layer portion where the insulating layer is partially thinned.

4. The method of fabricating the packaging substrate of claim 3, wherein the core substrate is made of glass.

* * * * *